United States Patent [19]
Sirattz

[11] Patent Number: 5,103,165
[45] Date of Patent: Apr. 7, 1992

[54] INSULATED, HAND-HELD NON-CONTACTING VOLTAGE DETECTION PROBE

[75] Inventor: James M. Sirattz, Raleigh, N.C.

[73] Assignee: Static Control Components, Inc., Sanford, N.C.

[21] Appl. No.: 615,620

[22] Filed: Nov. 19, 1990

[51] Int. Cl.⁵ .................. G01R 19/14; G01R 31/02
[52] U.S. Cl. .......................... 324/133; 324/72.5; 324/158 P
[58] Field of Search ............ 324/133, 72, 72.5, 158 P, 324/501, 519, 527, 528, 530, 555, 556, 149

[56] References Cited

U.S. PATENT DOCUMENTS

| | | | |
|---|---|---|---|
| 3,919,631 | 11/1975 | Brown | 324/133 X |
| 4,006,409 | 2/1977 | Adams | 324/133 X |
| 4,533,864 | 8/1985 | Austin | 324/133 X |
| 4,724,382 | 2/1988 | Schauerte | 324/133 |

Primary Examiner—Kenneth A. Wieder
Assistant Examiner—Warren S. Edmonds
Attorney, Agent, or Firm—Fleit, Jacobson, Cohn, Price, Holman & Stern

[57] ABSTRACT

A shock proof electrical probe comprises a probe tip, a casing for housing batteries, and a cap, each formed entirely of an electrically nonconductive plastic material. To establish an energizing circuit for the probe, the interior of the casing is provided with an elongated electrically conductive strip which extends longitudinally from contact with a circuit board in the probe tip, to an opposite open end of the casing, where the strip is mounted to the casing so as to bendable into electrical contact with an adjacent battery pole, and bendable in opposite direction to permit selective insertion and removal of the batteries from the casing. The probe further includes a steel carrying clip which is entirely encapsulated in electrically nonconductive plastic material. The probe may be of a noncontacting type, which utilizes an antenna for detecting the presence of an AC voltage, or a contacting type for detecting a the presence of a DC voltage. In either instance, when a voltage is present, a light-emitting diode is energized to produce a glow within the probe tip.

17 Claims, 4 Drawing Sheets

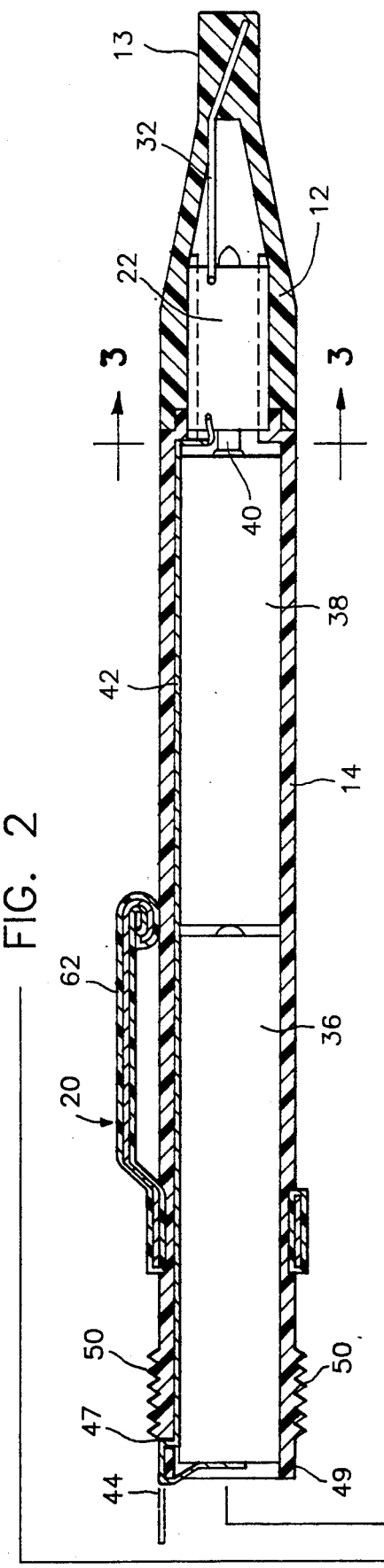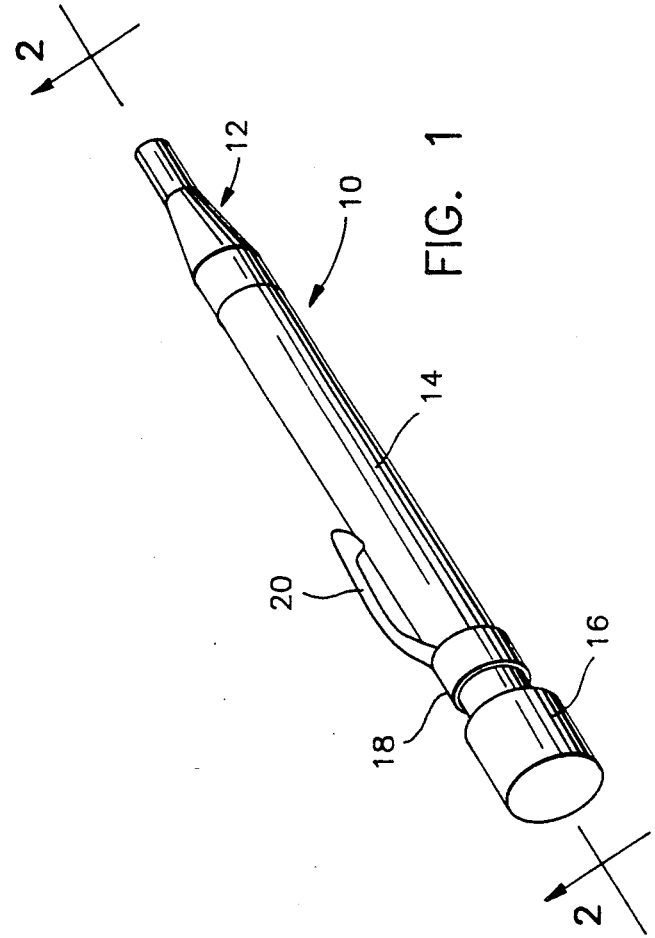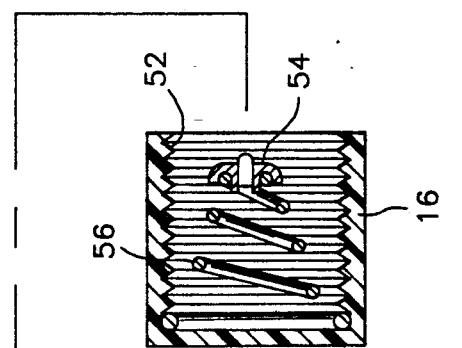

FIG. 10
TIMIMG CHART
TEST POINT
A          INDUCED INPUT
B     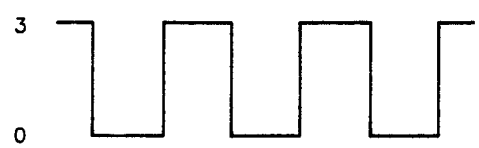     DC VOLTS
C     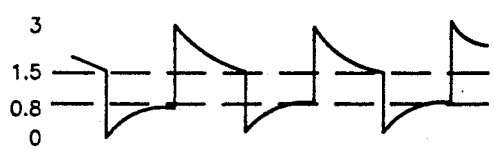     DC VOLTS
D     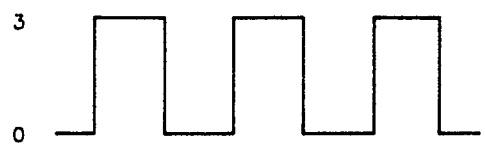     DC VOLTS
E     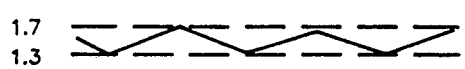     DC VOLTS
F & G     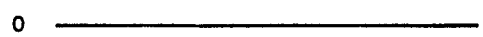     DC VOLTS
H          DC VOLTS

INSULATED, HAND-HELD NON-CONTACTING VOLTAGE DETECTION PROBE

BACKGROUND OF THE INVENTION

1. Field of the Invention

This invention relates to a hand-held, shock-resistant electrical probe, and more particularly to a hand-held, shock-resistant electrical probe which is formed essentially in its entirety of electrically nonconductive materials so as to eliminate the danger of electrical shock to the user.

2. Description of the Related Art

Hand-held electrical probes of a noncontacting or contacting type used for preventing electrical shock to the user, are known in the art. These devices are used around "live" naked wires, such as those in junction boxes. Electrical probe devices heretofore known include a metal casing coated with an electrically insulative material and/or an electrically conductive metal carrying clip attached to the casing. This design presents the danger of inadvertently contacting an uninsulated "naked wire", either at a break or scratch in the electrically nonconducting coating on the metal casing, or through contact with the metal clip, which could deliver a harmful electrical shock to the user holding the probe. Accordingly, a primary purpose of this invention is to provide a hand-held electrical probe in which the danger of electrical shock to the user is eliminated.

SUMMARY OF THE INVENTION

In general, the subject invention relates to a hand-held, shock-resistant electrical probe, which comprises a probe tip and a casing bonded together. Both the probe tip and casing are formed entirely of an electrically nonconductive material. A sensor is mounted in the probe tip for sensing the presence of an electrical voltage in an electrically conductive member when the probe tip is positioned adjacent the member, and an integrated circuit is supported adjacent the probe tip for receiving a signal from the sensor. The integrated circuit provides a signal to an indicator for indicating the presence of the electrical voltage. The sensor, integrated circuit and indicator are driven by a battery stored within the casing.

More specifically, the probe tip and casing are formed entirely of polyvinylchloride (PVC). The probe tip and casing are bonded together by the use of a suitable cement. An opposite open end of the casing from the end to which the probe tip is bonded is provided with a removable cap, also formed of PVC, for selectively opening or closing the casing open end for replacement of the battery. An elongated electrically conductive member, which may be in the form of an elongated flexible metal strip, is electrically connected at one end to the integrated circuit supported in the probe tip. The elongated metal strip extends longitudinally in the casing and has a bendable portion at an opposite end thereof adjacent the open end of the casing. The bendable portion is movable into engagement with an adjacent pole of the battery, to which it is held in contact with by the cap, and is bendable in an opposite direction to permit insertion and removal of the battery from the casing. Further, a metal carrying clip which is encased entirely in an electrically nonconductive material, may be provided on the casing. The indicator may be a light-emitting diode located in the probe tip so as to cause the probe tip to glow when a voltage is detected. The probe may be a noncontacting-type, with the sensor in the probe tip including an antenna for detecting the presence of an AC voltage in the region around a wire under test, or a contacting type wherein the sensor in the probe tip includes a contacting member for detecting the presence of a DC voltage.

BRIEF DESCRIPTION OF THE DRAWINGS

FIG. 1 is a schematic isometric view of a noncontacting type hand-held electrical probe according to a first embodiment of the present invention;

FIG. 2 is an enlarged cross-sectional view taken along the line 2—2 in FIG. 1;

FIG. 10 is a timing chart illustrating operational characteristics of an integrated circuit shown in FIGS. 5 and 6.

DETAILED DESCRIPTION

Figure 5:
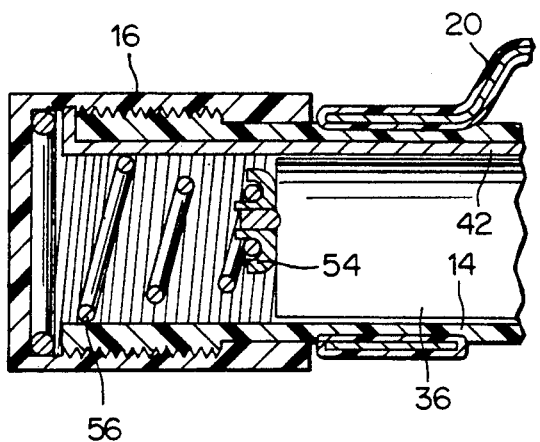
FIG. 5 is a partial cross-sectional view illustrating a portion of the screw cap attached to the casing according to a modification of the present invention.

Referring to FIG. 1, a hand-held, shock-resistant electrical probe of the noncontacting type in accordance with the invention is generally shown at 10. The probe 10 comprises a probe tip 12 bonded to one end of a hollow cylindrical casing 14 having a cap 16 screw threadably mounted on an opposite end thereof. A carrying clip 18 having a clip portion 20 for retaining the probe, for example, in a pocket of a user, is mounted on the casing 14 in a peripheral groove by means of a pair of opposed resilient securing portions integral with the clip retaining portion, described in more detail hereinafter.

Figure 3:
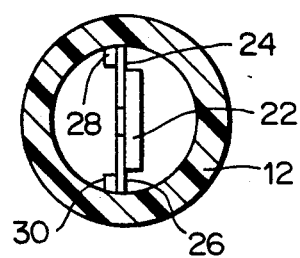
FIG. 3 is a cross-sectional view taken along the line 3—3 in FIG. 2.

More specifically, referring to the cross-sectional view of FIG. 2, the probe tip 12 has an essentially hollow interior and a rectangular extension 13. The probe tip 12 is formed of light transmissive polyvinylchloride material and is preferable white in color. The hollow interior of the probe tip 12 houses a circuit board 22 having opposite longitudinal edges 24 and 26 bonded to interior longitudinally extending integral rails 28 and 30, respectively, of the tip, as best shown in FIG. 3. The circuit board 22 comprises the circuitry shown in FIG. 8, including an integrated circuit of a known type and a voltage presence indicator in the form of a light-emitting diode. In the embodiment of the invention shown in FIG. 2, the circuit board 22 is connected to receive signals from an antenna 32 in the form of an electrically conductive wire connected to the circuit board 22 at one end and having an opposite end portion embedded in the rectangular tip extension 13 of the probe tip 12 so as to detect electrical energy without contacting the source of the energy.

In accordance with the invention, to reduce the possibility of electrical shock to the user, the probe tip 12 and casing 14 of the electrical probe are formed (by extrusion or injection molding) entirely of an electrically nonconductive material, such as an impact-resistant plastic, which preferably is polyvinylchloride (PVC). Similarly, the cap 16 also is formed entirely of an electrically nonconductive material, such as the same plastic material used to form the casing 14. PVC has been chosen for its self-extinguishing and non-dripping qualities. The probe tip 12 and casing 14 are attached by a suitable cement.

The casing 14 of the probe removably houses a pair of small electrical storage batteries shown at 36 and 38 in FIG. 2 (e.g., 1.5 volts) for operating the circuitry of the circuit board 2. For this purpose, a pole at one end of the battery 38 is engageable with a suitable contact 40 (e.g., leaf-type spring) mounted on the left-hand (or proximal) end of the circuit board 22, as viewed in FIG. 2. Further, since the casing 14 is formed entirely of electrically nonconductive plastic, to complete an electrical circuit through the batteries, an elongated electrically conductive strip 42 is provided along the interior of the casing 14. The elongated conductive strip is preferably formed of a metal such as brass.

The right-hand (or distal) end of the conductive strip 42 is electrically connected to the circuitry on the circuit board 22 and an adjacent portion of the strip 22 is bonded by a suitable adhesive to the interior of the casing 14. The conductive strip 42 extends longitudinally within the casing 14 to the proximal open end, at which it includes a flexible portion 44 at the end thereof which may be bent in one direction into electrical contact with an adjacent pole of the battery 36, as shown in solid lines in FIG. 2, and held in such engagement by the cap 16. The flexible portion 44 also is movable into a straight-line position, as shown in broken lines in FIG. 2, to permit insertion and removal of the batteries 36 and 38 from the interior of the casing 14.

As is best shown in FIG. 2, the carrying clip 20 comprises a core 62 made of a suitable metal material, which is encapsulated in an electrically nonconductive plastic material. By this construction, the clip 20 will maintain its structural integrity and prevent shocking the user through inadvertent contact with a live wire.

As is shown in FIG. 2, the left-hand (or proximal) end of the casing 14 as viewed in this Figure, is provided with external screw threads 50 which mate with internal screw threads 52 of the cap 16, so that the cap 16 may be attached to and removed from the casing 14. The cap 16 also includes a contact button 54 secured to the end of a conically shaped coil spring 56 mounted within the cap 16, so that when the cap 16 is attached to the casing 14, the contact button 54 firmly engages the flexible portion 44 of the conductive strip 42 to force the flexible portion 44 in firm electrical contact with the adjacent pole of battery 36, and to urge the batteries 36 and 38 inward in the casing 14 so that the pole of the battery 38 is held in firm electrical contact with the contact 40 of the circuit board 22, thus completing an electrical circuit between the batteries 36 and 38 and the circuit board 22.

Preferably, to further secure the conductive strip 42 to the casing 14, the inner wall of the casing 14 is provided with a through-slot 47 having dimensions essentially corresponding to the width and thickness of the conductive strip 42 at a flat portion 49 above the threads 50. The conductive strip 42 is extended outward through the through-slot 47 to the exterior of the casing 14. The strip 42 is then bent over the top of the casing and inserted downward into the interior thereof to make electrical contact with the pole of the battery 38 and held in contact by the button 54 in the cap 16 when the cap 16 is inserted over the end of the casing 14.

Figure 6:
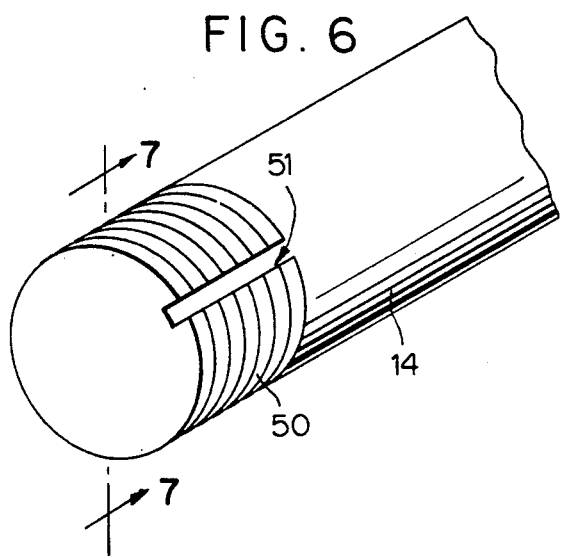
FIG. 6 is a perspective view of the casing shown in FIG. 5.
Figure 7:
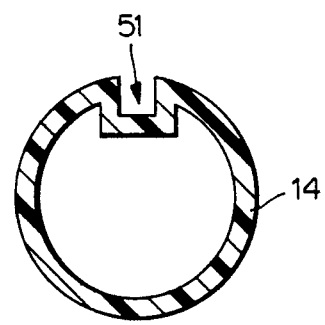
FIG. 7 is a cross-section view taken through line 7—7 of FIG. 6.

Alternatively, as another means for securing the conductive strip 42 to the casing 14, reference is made to FIGS. 5-7 which show that the casing 14 is provided with a groove 51 interrupting the threads 50. The groove 51 extends the length of the threads to the top of the casing 14. With this configuration, the flexible distal portion 44 of the conductive strip 42 is fed to the end of the casing 14, bent around the casing 14 and placed flat in the groove 51 along the exterior of the casing 14. When the cap 16 is screwed onto the casing 14, at least one of the turns or coils of spring 56 (which is made of electrically conductive metallic material) contacts the conductive strip 42. With the cap 16 completely screwed onto the casing 14, the button 54 attached to the spring 56 (and also made of metallic conductive material), and/or the end of the spring 56, makes contact with the pole of the battery 36. Thus, the power supply circuit is completed by indirectly making electrical contact between the conductive strip 42 and the battery 36 while the conductive strip is securely anchored to the casing 14.

Figure 4:
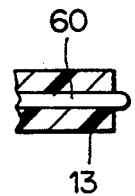
FIG. 4 is a partial cross-sectional view illustrating a portion of a probe tip of a contacting type hand-held probe for detecting DC voltage according to a second embodiment of the invention.

FIG. 4 illustrates another embodiment of the invention in which the electrical probe is a contact type device, and in which the antenna wire 32 in the noncontacting embodiment shown in FIG. 1-3, is replaced with an electrically conductive member 60 which projects from the rectangular extension 13 of the probe tip for the purpose of making direct electrical contact with an electrically conducting member to be tested. In this embodiment of the invention, the circuit board containing the circuitry as shown in FIG. 8, is replaced with a circuit board having circuitry as shown in FIG. 9.

Figure 8:
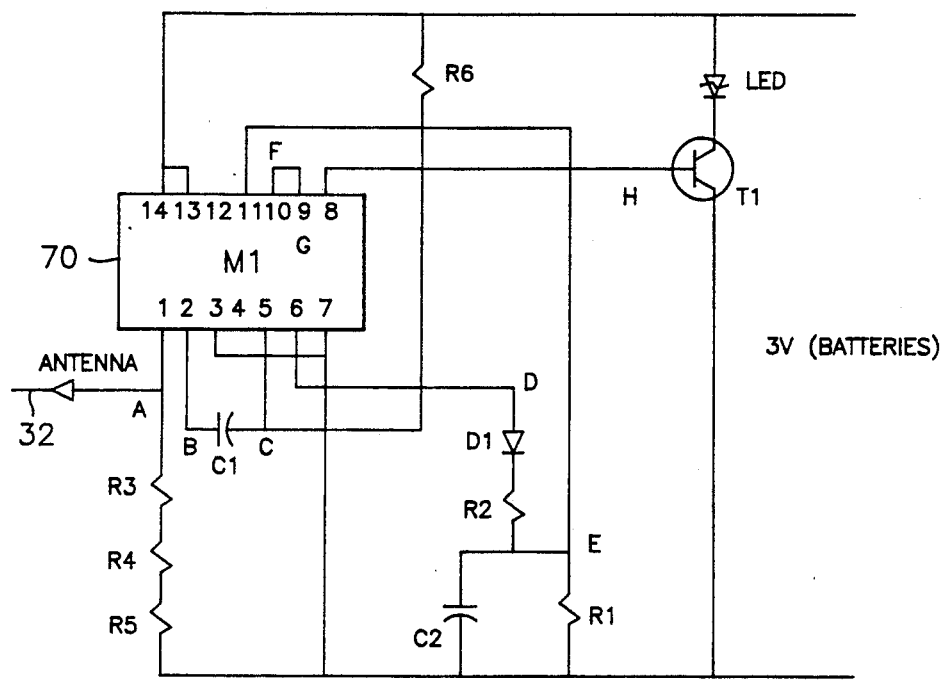
FIG. 8 is an electrical schematic of an integrated circuit used for the noncontacting type probe illustrated in FIG. 1-3.
Figure 9:
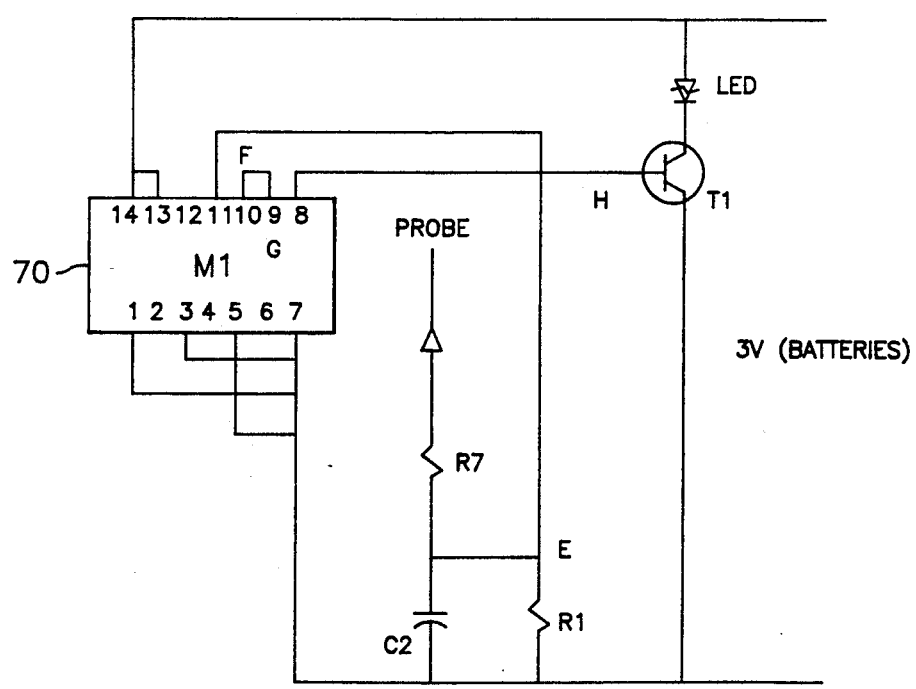
FIG. 9 is an electrical schematic of an integrated circuit used for the contact type probe shown in FIG. 4.

Referring to FIG. 8, the circuitry used with the noncontacting probe (FIGS. 1-3) to indicate the presence of a constantly changing electromagnetic field or AC voltage is shown. The circuit comprises an antenna network, including the antenna 32 which, when placed in close proximity to the electromagnetic field, will cause the LED to illuminate, indicating the presence of the constantly changing electromagnetic field. The antenna network also includes a series combination of resistors R3, R4, and R5, the multiple resistors being used instead of a single large resistor for ease of manufacturing. The circuit is intended to operate using a power source of 3.0 volts preferably derived from two 1.5 volt batteries.

An integrated circuit (IC) 70 forms an integral part of the circuitry shown in FIG. 8. The IC 70, as is well known in the art, has the ability to perform many functions otherwise achievable by individual electrical circuits. Also, as is well known in the art, the connections of external components to the pins (labeled 1-14) of the IC 70 determines how the IC functions are used. The IC 70 is preferably made by Motorola under model number MN14584BS. In the disclosed arrangement and for reference hereinafter an input high to the integrated circuit 70 is a voltage greater than 1.60 volts DC, an input low is less than 1.20 volts, an output high from the integrated circuit 70 is approximately 2.9 volts DC, and an output low from the integrated circuit 70 is approximately zero.

When the antenna network is in close proximity to an electromagnetic field, a voltage is induced at a point A. When this induced voltage is positive and greater than the turn-on threshold voltage of the integrated circuit 70, a Schmitt trigger in the integrated circuit 70 produces a corresponding low voltage output at point B to cause discharge of a capacitor C1, which is normally held in a fully charge state by pull-up resistor R6. A low voltage at point B causes the capacitor C1 to discharge and a low voltage to appear at point C, causing a high voltage to occur at point D.

A network which includes a diode D1, a capacitor C2, and resistors R1 and R2, is used to smooth out the "square-wave" wave form output of point D. When point D is high, the capacitor C2 is charged through the diode D1 and the resistor R2. When point D is low, the capacitor C2 discharges through the resistor R1 and point E. The balance of the network allows the circuit to provide a high input signal to the circuit point E, as long as the antenna network remains in the constantly changing electromagnetic field.

Referring to FIG. 10, operation of the circuitry shown in FIG. 8 will now be explained in more detail. With the antenna network in a constantly changing electromagnetic field, the induced voltage at point A changes in response to the electromagnetic field. In response to this input IC 70 at point A, an output from the IC 70 is generated at point B which is an inverted "squared-up" version of the input, and the input at the point C is similar to the output at the point B. Similarly, the output at the point D is an inverted "squared-up" version of the input at the point C.

When the signal at point E is high, the output signal from the IC 70 at a point F is low, and since point F is tied directly to point G, the input at the point G is low. When point G is low the output from the IC 70 at a point H is high, which turns on a transistor T1. When the transistor T1 is on, the LED also is turned on, and the voltage at point H is constant at approximately 1.0 volts DC. When the LED is on, it produces a glow in the plastic probe tip to indicate that the antennae is in the presence of a constantly changing electromagnetic field of sufficient strength to induce a positive voltage at the point A that is greater than the turn-on threshold voltage of the integrated circuit.

Referring to FIG. 9, the circuit, which is used with a contact type probe illustrated by FIG. 4 will be described. This circuit indicates the presence of a DC voltage and also uses a voltage source of 3.0 volts DC. For this purpose, as in the circuit shown in FIG. 8, an IC 70 is used having the same parameters aforementioned. The turn-on threshold for the IC can be varied, and for this embodiment, the turn-on threshold is set at 10 volts. The circuit shown in FIG. 9 includes most of the same circuitry components of FIG. 8 with the exception of resistor R6 which is not needed and additional resistor R7 which is connected between the conductor 60 (FIG. 4) and the capacitor C2.

In the contact type probe, it is necessary to first attach a negative (ground) clip to a negative (ground) terminal of a circuit to be tested. Then, when the conductor 60 is placed in direct contact with a portion of the test circuit that has a DC voltage greater than 10 volts, a high input voltage greater than 1.7 volts is seen at an input point E. This forces point F low, and therefore point G low. Point H is therefore high, which remains constant and approximately 1.0 volts DC, to turn on transistor T1, causing energization of a light-emitting diode (LED) indicating that the probe is in contact with a DC voltage greater than 10 volts.

While various circuit combinations for practicing the invention as disclosed herein above will be apparent to those skilled in the art, the noncontacting circuit shown in FIG. 8 may use circuit parameters as follows: diode D1, IN4148; transistor T1, BC847C; LED, LNZ8CP; R1, 18.5 milliohms; R2, milliohms; R3, 65 milliohms; R4, 200 milliohms; R5, 65 milliohms; R6, 10 milliohms; C1, 10 nanofarads; and C2, 4 nanofarads. Similarly, corresponding devices in the contacting circuit of FIG. 9 may have the same values, with R7=88 milliohms.

In summary, a new and improved electrical probe, which is of shock-resistant construction, so as to eliminate the danger of electrical shock to the user, has been disclosed. This is accomplished by making the probe tip, casing and cap entirely of electrically nonconductive plastic construction and also coating the steel carrying clip with an electrically nonconductive plastic. To establish an energizing circuit for the probe, the interior of the probe casing includes an elongated conductive strip, which extends longitudinally from electrical contact with the circuit board in the probe tip, to the opposite open end of the casing in which it is mounted so as to be bendable into electrical contact with the adjacent battery pole, and bendable in an opposite direction to permit insertion and removal of the batteries from the probe casing.

The above description is intended by way of example only and is not intended to limit the present invention in any way, except as set forth in the following claims.

I claim:

1. A hand-held totally insulated, non-contacting electrical probe comprising:
   a probe tip formed entirely of an electrically nonconductive material;
   sensor means mounted entirely within the probe tip for sensing the presence of electrical energy radiated from an electrically conductive member when the probe tip is positioned adjacent the member;
   indicator means mounted in the probe tip for indicating the presence of the electrical energy;
   integrated circuit means supported within the probe tip for receiving a signal from the sensor means and transmitting the signal to the indicating means;
   casing means formed entirely of an electrically nonconductive material, said casing means holding a power source for operating the sensor means, the integrated circuit means and the indicating means; and
   bonding means for bonding the probe tip to the casing means.

2. The hand-held electrical probe according to claim 1, wherein the probe tip and casing means are formed entirely of PVC.

3. The hand-held electrical probe according to claim 1, and further comprising a removable cap, and wherein the casing means comprises an elongated cylindrical, hollow member having first and second opposite ends, the first end being bonded to the probe tip, so as to permit connection of the power source to the integrated circuit means, the removable cap being removably attached to the second end for permitting access to the interior of the hollow member for replacement of the power source.

4. The hand-held electrical probe according to claim 3, wherein the cap is formed entirely of PVC.

5. The hand-held electrical probe according to claim 3, and further comprising first electrical contact means electrically connected to the integrated circuit means and an elongated electrically conductive metal strip mounted in the hollow member and connected at a first end to the integrated circuit means, and longitudinally in the hollow member from the first end thereof to a point proximate the second end thereof; and wherein the hollow member is adapted to receive at least one electrical battery having a first pole which is engageable with the first electrical contact connected means; and the cap including engaging means for forcing a second end portion of the electrically conductive metal strip into electrical contact with a second pole of the battery.

6. The hand-held electrical probe according to claim 5, wherein the electrically conductive metal strip is mounted to the hollow member to prevent movement in the interior of the hollow member adjacent the first end thereof.

7. The hand-held electrical probe according to claim 6, wherein the electrically conductive metal strip is bendable at a portion at the second end thereof in a first direction to make electrical contact with the second pole of at least one battery, and is bendable in a second direction opposite to the first direction to permit insertion and removal of said at least one battery from the hollow member.

8. The hand-held electrical probe according to claim 6, wherein the metal strip is formed of brass.

9. The hand-held electrical probe according to claim 5, wherein the engaging means of the cap is spring-biased.

10. The hand-held electrical probe according to claim 1, which further comprises a metal carrying clip mounted on the casing means, the metal carrying clip being encased entirely in an electrically nonconductive material.

11. The hand-held electrical probe according to claim 10, wherein the metal clip is formed of plastic-coated steel.

12. The hand-held electrical probe according to claim 1, wherein the indicator is a light-emitting diode mounted in the probe tip so as to cause the probe tip to glow when a voltage is detected.

13. A hand-held totally insulated, non-contacting electrical probe comprising:
    a probe tip formed entirely of an electrical nonconductive and substantially light transmissive material, the probe tip having a proximal cylinder portion and a distal tip portion of rectangular cross section, the probe tip having a tapered portion connecting the cylinder portion with the distal tip portion;
    sensor means comprising an electrically conductive wire being mounted entirely within the distal tip portion of the probe tip for detecting the presence of changing electrical fields in a region immediately adjacent the probe tip without contacting a source of the field;
    illumination indicator means contained in said probe tip for indicating the presence of electrical energy by illuminating the tapered portion and the distal tip portion;
    circuit means supported in said cylinder portion of the probe tip and being responsive to the sensor means for energizing the illumination indicator means;
    casing means formed entirely of an electrically nonconductive material and comprising a hollow cylindrical chamber having first and second opposite ends, the hollow cylindrical chamber containing first and second batteries arranged in series for supplying electrical power to the illumination indicator means, circuit means and the sensor means, the cylinder portion of the probe tip being bonded to the casing means at the first end of said casing means, the second end of the casing means having external screw threads;
    a contact member electrically connected to said circuit means and mounted in said casing means proximate the first end of the casing means to electrically contact with a pole at the end of one of said batteries;
    an elongated conductive strip electrically connected to said circuit means proximate the first end of the casing means and extending along the interior of said casing means in said hollow cylindrical chamber to the second end of said casing means, the elongated conductive strip having a bendable end portion terminating the strip at approximately the second end of the casing means, the bendable portion being bendable in a first direction to contact a pole of a battery proximate the first end of the casing means and being bendable in a second direction perpendicular to the first direction to lie substantially parallel to the casing means to permit access to said hollow cylindrical chamber for inserting and removing the batteries; and
    a cap for closing the hollow cylindrical chamber of the casing means and comprising internal screw threads for mating with the external screw threads at the second end of the casing means, the cap further comprising a coiled spring secured thereto and a button contact member attached to a free end of the coil spring, the button contact member engaging the elongated conductive strip when the cap is firmly secured to the casing means for forcing the elongated conductive strip into electrical contact with the pole of the battery proximate the second end of the casing means.

14. The hand-held electrical prove according to claim 13, and further comprising a clip member attached to the exterior of said casing means, said clip member comprising a metal core encased by electrically nonconductive plastic.

15. The hand-held electrical probe according to claim 13, wherein a slot is provided in a region of the casing means proximate the second end thereof, said elongated conductive strip being insertable through the slot to the exterior of the casing means, the elongated conductive strip being bendable over the second end of the casing means to extend back into the interior of the casing means over transversely in contact with the pole of the battery proximate the second end of the casing means, and the cap being inserted over the elongated strip and the second end of the casing means.

16. A hand-held totally insulated, non-contacting electrical probe comprising:
    a probe tip formed entirely of an electrical-nonconductive and substantially light transmissive material, the probe tip having a proximal cylinder portion, a distal tip portion of rectangular cross-section and a tapered portion connecting the cylinder portion with the distal tip portion;

sensor means comprising an electrically conductive wire being mounted entirely within the distal tip portion of the probe tip for detecting the presence of changing electrical fields in a region immediately adjacent the probe tip without contacting a source of the field;

illumination indicator means contained in said probe tip for indicating the presence of electrical energy by illuminating the tapered portion and the distal tip portion;

circuit means supported in said cylinder portion of the probe tip and being responsive to the sensor means for energizing the illumination indicator means;

casing means formed entirely of an electrically-non-conductive material and comprising a hollow cylindrical chamber having first and second opposite ends, the hollow cylindrical chamber containing first and second batteries arranged in series for supplying electrical power to the illumination indicator means, circuit means and the sensor means, the cylinder portion of the probe tip being bonded to the casing means at the first end of said casing means, the second end of the casing means having external screw threads and a longitudinal groove interrupting the external screw threads on an exterior surface of the casing means and extending to the second end of the casing means;

a contact member electrically connected to said circuit means and mounted in said casing means proximate the first end of the casing means to electrically contact with a pole at the end of one of said batteries;

an elongated conductive strip electrically connected to said circuit means proximate the first end of the casing means and extending along the interior of said casing means in said hollow cylindrical chamber to the second end of said casing means, the elongated conductive strip having a bendable end portion terminating the strip at approximately the second end of the casing means, the bendable portion being bendable outside the second end of the casing means and into the longitudinal groove substantially flush with the exterior surface of the casing means; and a cap member for closing the hollow cylindrical chamber of the casing means and comprising internal screw threads for mating with the external screw threads at the second end of the casing means, the cap member further comprising an electrical conductive coiled spring secured thereto and an electrical conductive button contact member attached to a free end of the coil spring, at least one turn of the coiled spring making electrical contact with the elongated conductive strip when the cap member is screwed onto the casing means, an end of the coiled spring or the button contact member making electrical contact with the pole of the battery proximate the second end of the casing means so as to complete a circuit between the elongated conductive strip and the battery.

17. The hand-held electrical probe according to claim 16, wherein the probe tip, casing means and cap are formed of PVC.

* * * * *